(12) United States Patent
Kim et al.

(10) Patent No.: US 12,507,533 B2
(45) Date of Patent: Dec. 23, 2025

(54) ELECTROLUMINESCENT DISPLAY APPARATUS

(71) Applicant: LG Display Co., Ltd., Seoul (KR)

(72) Inventors: Ho-Jin Kim, Paju-si (KR); Hansun Park, Paju-si (KR); Hyeongjun Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 914 days.

(21) Appl. No.: 17/545,725

(22) Filed: Dec. 8, 2021

(65) Prior Publication Data

US 2022/0208880 A1     Jun. 30, 2022

(30) Foreign Application Priority Data

Dec. 31, 2020    (KR) ..................... 10-2020-0188993

(51) Int. Cl.
*H10K 59/122*     (2023.01)
*H10K 59/35*     (2023.01)
*H10K 59/80*     (2023.01)

(52) U.S. Cl.
CPC ......... *H10K 59/122* (2023.02); *H10K 59/353* (2023.02); *H10K 59/8731* (2023.02); *H10K 59/879* (2023.02)

(58) Field of Classification Search
CPC .... H10K 59/122; H10K 59/131; H10H 29/37; H10H 29/49
See application file for complete search history.

(56) References Cited

U.S. PATENT DOCUMENTS

| | | |
|---|---|---|
| 9,923,167 B2 | 3/2018 | Choi et al. |
| 10,164,211 B2 | 12/2018 | Kim et al. |
| 10,199,602 B2 | 2/2019 | Choi et al. |
| 10,290,687 B2 | 5/2019 | Lee et al. |
| 10,304,913 B2 | 5/2019 | Choi et al. |
| 10,777,626 B2 | 9/2020 | Choi et al. |

(Continued)

FOREIGN PATENT DOCUMENTS

| | | |
|---|---|---|
| KR | 10-2016-0108800 A | 9/2016 |
| KR | 10-2017-0066767 A | 6/2017 |

(Continued)

OTHER PUBLICATIONS

Korean Intellectual Property Office, Office Action, Korean Patent Application No. 10-2020-0188993, Jul. 29, 2024, 21 pages.

*Primary Examiner* — Amar Movva
(74) *Attorney, Agent, or Firm* — Fenwick & West LLP

(57) ABSTRACT

An electroluminescent display apparatus includes a substrate including a display area and a non-display area outside the display area, a first electrode provided in each of a plurality of subpixels in the display area of the substrate, a connection electrode provided in the non-display area of the substrate, a bank covering both ends of the first electrode and covering a top surface of the connection electrode, a light emitting layer provided on the first electrode and the bank in the display area and the non-display area, and a second electrode provided on the light emitting layer, wherein, a trench is provided in the bank in the non-display area, one side surface of the connection electrode is exposed at an inner portion of the trench, and the second electrode extends to the inner portion of the trench and contacts the one side surface of the connection electrode.

20 Claims, 11 Drawing Sheets

(56) References Cited

U.S. PATENT DOCUMENTS

| | | | |
|---|---|---|---|
| 11,018,210 B2 | 5/2021 | Choi et al. | |
| 11,778,866 B2 | 10/2023 | Choi et al. | |
| 2016/0079326 A1* | 3/2016 | Chang | H10K 59/123 438/23 |
| 2016/0260928 A1 | 9/2016 | Choi et al. | |
| 2017/0033166 A1* | 2/2017 | Shim | H10K 59/1315 |
| 2017/0059960 A1* | 3/2017 | Shi | G06F 3/0346 |
| 2017/0162637 A1 | 6/2017 | Choi et al. | |
| 2018/0122882 A1* | 5/2018 | Lee | H10K 59/124 |
| 2018/0123088 A1 | 5/2018 | Kim et al. | |
| 2018/0151643 A1 | 5/2018 | Lee et al. | |
| 2018/0198092 A1 | 7/2018 | Choi et al. | |
| 2019/0140212 A1* | 5/2019 | Park | H10K 59/131 |
| 2019/0245020 A1 | 8/2019 | Choi et al. | |
| 2020/0411616 A1 | 12/2020 | Choi et al. | |
| 2021/0280648 A1 | 9/2021 | Choi et al. | |
| 2021/0367000 A1* | 11/2021 | Kim | G06F 3/04164 |
| 2024/0032347 A1 | 1/2024 | Choi et al. | |

FOREIGN PATENT DOCUMENTS

| | | |
|---|---|---|
| KR | 10-2018-0013226 A | 2/2018 |
| KR | 10-2018-0047535 A | 5/2018 |
| KR | 10-2018-0062109 A | 6/2018 |
| KR | 10-1976832 B1 | 5/2019 |
| KR | 10-2020-0069838 A | 6/2020 |
| KR | 10-2020-0072745 A | 6/2020 |

* cited by examiner

ELECTROLUMINESCENT DISPLAY APPARATUS

CROSS-REFERENCE TO RELATED APPLICATION

This application claims the benefit of the Republic of Korea Patent Application No. 10-2020-0188993 filed on Dec. 31, 2020, which is hereby incorporated by reference in its entirety.

BACKGROUND

Field of Technology

The present disclosure relates to an electroluminescent display apparatus.

Discussion of the Related Art

Electroluminescent display apparatuses are apparatuses where a light emitting layer is provided between two electrodes (i.e., an anode electrode and a cathode electrode) and emits light with an electric field generated between the two electrodes, thereby displaying an image.

The light emitting layer may be formed of an organic material or an inorganic material such as a quantum dot. In the light emitting layer, an exciton is generated by a combination of an electron and a hole, and when the exciton is shifted from an excited state to a ground state, light is emitted.

The light emitting layer may emit light of different colors (for example, red, green, and blue) in subpixels and may emit light of the same color (for example, white light) in the subpixels.

In a case where a light emitting layer emitting the same white light is applied, it is not required to pattern the light emitting layer in each subpixel. However, when the light emitting layer is formed in all of a non-display area, it is difficult to perform a process of connecting a cathode electrode, formed on the light emitting layer, to a line formed under the light emitting layer, and due to this, the light emitting layer is deposited in a state where a certain region of the non-display area is covered by a mask.

However, in this case, particles remaining in the mask penetrate into the light emitting layer, causing a reduction in emission characteristic.

SUMMARY

Accordingly, the present disclosure is directed to providing an electroluminescent display apparatus that substantially obviates one or more problems due to limitations and disadvantages of the related art.

An aspect of the present disclosure is directed to providing an electroluminescent display apparatus in which a light emitting layer is formed without a mask, thereby preventing or at least reducing the occurrence of particles caused by the mask.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an electroluminescent display apparatus including a substrate including a display area and a non-display area outside the display area, a first electrode provided in each of a plurality of subpixels in the display area of the substrate, a connection electrode provided in the non-display area of the substrate, a bank covering both ends of the first electrode and covering a top surface of the connection electrode, a light emitting layer provided on the first electrode and the bank in the display area and the non-display area, and a second electrode provided on the light emitting layer, wherein, a trench is provided in the bank in the non-display area, one side surface of the connection electrode is exposed at an inner portion of the trench, and the second electrode extends to the inner portion of the trench and contacts the one side surface of the connection electrode.

In another aspect of the present disclosure, there is provided an electroluminescent display apparatus including a substrate including a display area and a non-display area outside the display area, a first electrode provided in each of a plurality of subpixels in the display area of the substrate, a light emitting layer provided on the first electrode in the display area and the non-display area, a second electrode provided on the light emitting layer in the display area and the non-display area, a connection electrode provided in the non-display area to overlap the second electrode and connected to the second electrode, and a trench provided in the non-display area to overlap the second electrode and contact one side of the connection electrode, wherein the second electrode contacts the connection electrode in the trench.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
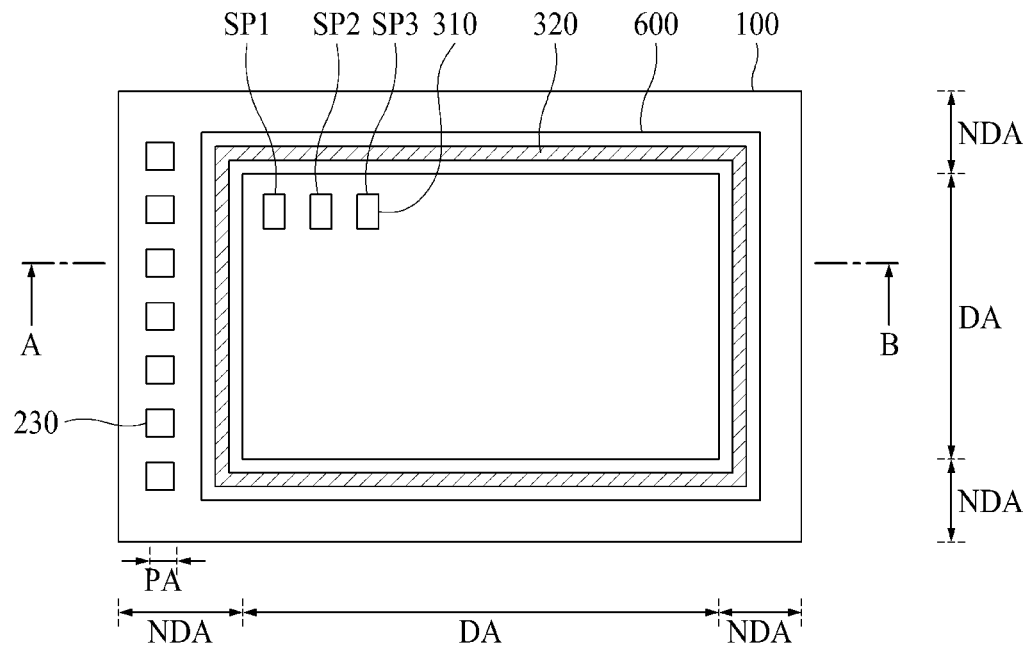
FIG. 1 is a schematic plan view of an electroluminescent display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a schematic plan view of an electroluminescent display apparatus according to an embodiment of the present disclosure.

As seen in FIG. 1, the electroluminescent display apparatus according to an embodiment of the present disclosure may include a substrate 100, a first electrode 310, a connection electrode 320, and a second electrode 600.

A display area DA and a non-display area NDA may be provided in the substrate 100.

The display area DA may be an area which displays an image, and a plurality of subpixels SP1 to SP3 may be provided in the display area DA.

The plurality of subpixels SP1 to SP3 may include a first subpixel SP1, a second subpixel SP2, and a third subpixel SP3, which are arranged in a first direction (for example, a widthwise direction). The first subpixel SP1 may be provided to emit light of a first color (for example, red light), the second subpixel SP2 may be provided to emit light of a second color (for example, green light), and the third subpixel SP3 may be provided to emit light of a third color (for example, blue light). However, the present disclosure is not limited thereto. An arrangement structure of the plurality of subpixels SP1 to SP3 may be changed to various structures known to those skilled in the art.

The non-display area NDA may be an area which does not display an image and may be provided to surround the display area DA, outside the display area DA.

A pad area PA may be provided in the non-display area NDA. A plurality of pad electrodes 230 may be arranged in the pad area PA, and thus, signals may be supplied to various circuit elements of the display area DA through the plurality of pad electrodes 230. Therefore, although not shown, a link line connecting the plurality of pad electrodes 230 to the various circuit elements of the display area DA may be provided in the non-display area NDA. The pad area PA may be provided at one side of the substrate 100 as illustrated, but depending on the case, may be additionally provided at another side of the substrate 100.

The first electrode 310 may be patterned in each of the plurality of subpixels SP1 to SP3 in the display area DA. The first electrode 310 may function as an anode in each of the first to third subpixels SP1 to SP3. The first electrode 310 may be electrically connected to a source electrode or a drain electrode of a driving thin film transistor (TFT) included in each of the first to third subpixels SP1 to SP3.

The connection electrode 320 may be provided in the non-display area NDA. The connection electrode 320 may electrically connect the second electrode 600 to a common electrode. The connection electrode 320 may be connected to an edge portion of the second electrode 600, and thus, the connection electrode 320 may overlap the edge portion of the second electrode 600. Particularly, the connection electrode 320 may be connected to all of edge portions of four sides of the second electrode 600, and thus, may be implemented in a frame structure which is continued along an outer portion of the display area DA. In detail, the connection electrode 320 may be implemented in a tetragonal frame structure which is continued in a region between the display area DA and an end of the second electrode 600. In the present disclosure, a frame structure may denote a structure where an inner portion thereof is hollow like picture frames or donuts.

The second electrode 600 may extend up to the non-display area NDA from the display area DA. In one embodiment, the second electrode 600 may overlap all of the display area DA and may extend to a partial region of the non-display area NDA. The second electrode 600 may function as a cathode in each of the first to third subpixels SP1 to SP3. A common voltage may be applied to the second electrode 600, and thus, the second electrode 600 may be electrically connected to the common electrode. In detail, the second electrode 600 may be connected to the common electrode through the connection electrode 320 described above, and this may be easily understood with reference to a cross-sectional view which will be described below.

Figure 2:
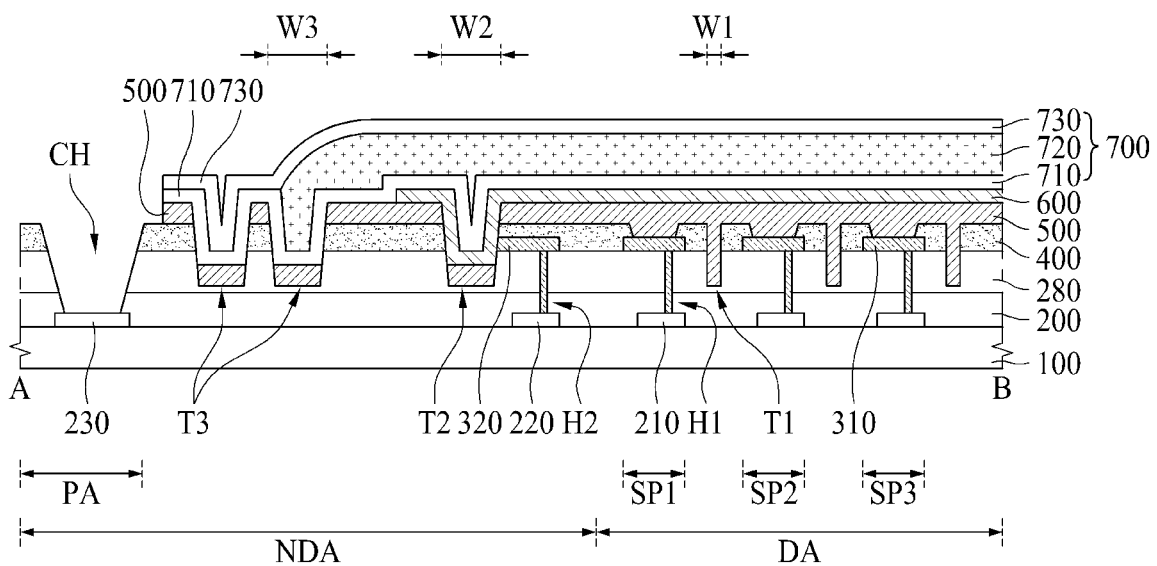
FIG. 2 is a schematic cross-sectional view of an electroluminescent display apparatus according to an embodiment of the present disclosure and corresponds to a cross-sectional surface taken along line A-B of FIG. 1.

FIG. 2 is a schematic cross-sectional view of an electroluminescent display apparatus according to an embodiment of the present disclosure and corresponds to a cross-sectional surface taken along line A-B of FIG. 1.

As seen in FIG. 2, the electroluminescent display apparatus according to an embodiment of the present disclosure may include a substrate 100, a circuit element layer 200, an interlayer insulation layer 280, a first electrode 310, a connection electrode 320, a bank 400, a light emitting layer 500, a second electrode 600, and an encapsulation layer 700.

The substrate 100 may include glass or plastic, but is not limited thereto and may be formed of a semiconductor material such as a silicon wafer. The substrate 100 may include a display area DA and a non-display area NDA.

The circuit element layer 200 may be provided on the substrate 100. The circuit element layer 200 may be provided in the display area DA and the non-display area NDA.

A circuit element including various signal lines, a TFT, a capacitor, and the like may be provided in the circuit element layer 200 provided in the display area DA, in each of subpixels SP1 to SP3.

The signal lines may include a gate line, a data line, a power line, and a reference line, and the TFT may include a switching TFT, a driving TFT, and a sensing TFT.

The switching TFT may be turned on based on a gate signal supplied through the gate line and may transfer a data voltage, supplied through the data line, to the driving TFT.

The driving TFT may be turned on with the data voltage supplied through the switching TFT and may generate a data current from power supplied through the power line to supply the data current to the first electrode 310. The driving TFT may include a source or drain electrode 210 electrically connected to the first electrode 310.

The sensing TFT may sense a threshold voltage deviation of the driving TFT which causes a degradation in image quality and may supply a current of the driving TFT to the reference line in response to a sensing control signal supplied through the gate line or a separate sensing line.

The capacitor may hold the data voltage supplied to the driving TFT during one frame and may be connected to each of a gate electrode and a source electrode of the driving TFT.

Each of the switching TFT, the driving TFT, and the sensing TFT may be changed to have various structures such as a top gate structure and a bottom gate structure known to those skilled in the art.

A common electrode 220 and a pad electrode 230 may be included in the circuit element layer 200 provided in the non-display area NDA.

The common electrode 220 may be electrically connected to the second electrode 600 and may apply the common voltage to the second electrode 600. Particularly, the common electrode 220 may be electrically connected to the second electrode 600 through the connection electrode 320. The common electrode 220 may be simultaneously formed of the same material on the same layer as the source or drain electrode 210.

The pad electrode 230 may be provided in the pad area PA. A top surface of the pad electrode 230 may be exposed at the outside so as to receive a signal from an external driving element. Therefore, a contact hole CH may be formed in a certain region of each of the interlayer insulation layer 280, and the bank 400 which are formed on the pad electrode 230, and thus, the pad electrode 230 may be connected to the external driving element through the contact hole CH. Also, the light emitting layer 500 and the encapsulation layer 700 may be removed from the pad area PA and the second electrode 600 may not extend to the pad area PA, and thus, the top surface of the pad electrode 230 may be exposed at the outside.

The pad electrode 230 may be electrically connected to the common electrode 220 or the source or drain electrode 210 through the link line. The pad electrode 230 may be simultaneously formed of the same material on the same layer as the common electrode 220.

The interlayer insulation layer 280 may be formed on the circuit element layer 200. The interlayer insulation layer 280 may be provided in the display area DA and the non-display area NDA.

A first hole H1 and a second hole H2 may be formed in the circuit element layer 200 and the interlayer insulation layer 280.

The first hole H1 may be provided in the display area DA and may electrically connect the source or drain electrode 210 to the first electrode 310. That is, the source or drain electrode 210 may be connected to the first electrode 310 through the first hole H1 which is formed in the circuit element layer 200 and the interlayer insulation layer 280. In this case, a conductive via may be filled into the first hole H1, or the first electrode 310 may be filled into the first hole H1.

The second hole H2 may be provided in the non-display area NDA and may electrically connect the common electrode 220 to the connection electrode 320. That is, the common electrode 220 may be connected to the connection electrode 320 through the second hole H2 which is formed in the circuit element layer 200 and the interlayer insulation layer 280. In this case, a conductive via may be filled into the second hole H2, or the connection electrode 320 may be filled into the second hole H2.

The interlayer insulation layer 280 may be formed of a single layer, or may be formed of a combination of a plurality of insulation layers. Although not shown, a reflective layer may be added to a bottom surface, a top surface, or an inner portion of the interlayer insulation layer 280 in the subpixels SP1 to SP3, and thus, a micro-cavity may be implemented between the reflective layer and the second electrode 600 for each of the subpixels SP1 to SP3.

The first electrode 310 may be patterned in each of the subpixels SP1 to SP3, on the interlayer insulation layer 280. As described above, the first electrode 310 may function as an anode of the electroluminescent display apparatus and may be connected to the source or drain electrode 210 through the first hole H1 which is provided in the circuit element layer 200 and the interlayer insulation layer 280.

The connection electrode 320 may be formed in the non-display area NDA, on the interlayer insulation layer 280. The connection electrode 320 may be simultaneously formed of the same material on the same layer as the first electrode 310. As described above, the connection electrode 320 may connect the common electrode 220 to the second electrode 600 and may be connected to the common electrode 220 through the second hole H2 which is provided in the circuit element layer 200 and the interlayer insulation layer 280.

The bank 400 may be formed on the interlayer insulation layer 280 and may be provided in the display area DA and the non-display area NDA.

The bank 400 provided in the display area DA may be implemented to expose a portion of the top surface of the first electrode 310 and to cover both ends of the first electrode 310. A portion, which is uncovered by the bank 400 and exposed, of the top surface of the first electrode 310 may be an emission area. Because the bank 400 covers both ends of the first electrode 310, a problem may be solved where a current concentrates on an end of the first electrode 310, and due to this, emission efficiency is reduced.

In the display area DA, a first trench T1 may be included in the bank 400 and the interlayer insulation layer 280 thereunder. The first trench T1 may be formed in a boundary region between the subpixels SP1 to SP3 to prevent or at least reduce a leakage current caused by the movement of an electric charge from occurring between adjacent subpixels SP1 to SP3. This will be described below with reference to FIG. 4. The first trench T1, as illustrated, may be formed to pass through the bank 400 and does not pass through the interlayer insulation layer 280, but is not limited thereto and may pass through the interlayer insulation layer 280 and may be extended up to a partial region of the circuit element layer 200 thereunder. The first trench T1 may be the same as a second trench T2 and a third trench T3 which will be described below.

The bank 400 provided in the non-display area NDA may be formed not to cover one side surface of the connection electrode 320 and to cover a top surface and the other side surface of the connection electrode 320. In detail, in the non-display area NDA, the second trench T2 may be provided in the bank 400 and the interlayer insulation layer 280 thereunder, and one end of the second trench T2 may expose the one side surface of the connection electrode 320. Accordingly, the one side surface of the connection electrode 320 may be exposed at an inner portion of the second trench T2.

The second trench T2 may allow the second electrode 600 to be connected with the connection electrode 320. In detail, the second electrode 600 may be connected to the connection electrode 320, in the second trench T2. To this end, a width W2 of the second trench T2 may be set to be greater than a width W1 of the first trench T1 according to one embodiment. This may be understood with reference to FIG. 5 which will be described below.

The second trench T2 may be formed to overlap the second electrode 600, expose the one side surface of the connection electrode 320, and correspond to the connection electrode 320. In detail, the second trench T2 may be implemented in a tetragonal frame structure which is continued between an end of the second electrode 600 and the one side surface of the connection electrode 320. This may be understood with reference to FIG. 3 which will be described below.

Moreover, in the non-display area NDA, a plurality of third trenches T3 may be provided in the bank 400 and the interlayer insulation layer 280 thereunder. The plurality of third trenches T3 may be provided in a region between the second trench T2 and the pad area PA.

The plurality of third trenches T3 may prevent or at least reduce the organic layer 720 of the encapsulation layer 700 from spreading (e.g., extending) to an end of the substrate 100. To this end, a width W3 of each of the third trenches T3 may be set to be greater than the width W1 of the first trench T1 according to one embodiment. The width W3 of each of the third trenches T3 may be set to be equal to the width W2 of the second trench T2, but is not limited thereto.

Each of the third trenches T3 may be implemented in a tetragonal frame structure which is continued between the end of the second electrode 600 and the end of the substrate 100. This may be understood with reference to FIG. 3 which will be described below.

The light emitting layer 500 may be formed on the first electrode 310 and the bank 400. The light emitting layer 500 may be provided in the display area DA and the non-display area NDA.

The light emitting layer 500 may be formed in a region corresponding to the plurality of subpixels SP1 to SP3 and a boundary region between the plurality of subpixels SP1 to SP3 in the display area DA, but a portion of the light emitting layer 500 may be formed to be discontinuous in the first trench T1, and thus, the occurrence of a leakage current between adjacent subpixels SP1 to SP3 may be prevented or at least reduced. This will be described below in detail with reference to FIG. 4.

The light emitting layer 500 may be formed to be discontinuous in the second trench T2 and to be discontinuous in the third trench T3 in the non-display area NDA. This will be described below in detail with reference to FIGS. 5 and 6.

The second electrode 600 may be formed on the light emitting layer 500. The second electrode 600 may function as a cathode of the electroluminescent display apparatus.

The second electrode 600 may be provided in the display area DA and the non-display area NDA.

The second electrode 600 may be formed in all of the display area DA. That is, the second electrode 600 may be formed to be continued in each of the subpixels SP1 to SP3 and a boundary region therebetween, in the display area DA.

The second electrode 600 may less extend to the non-display area NDA than the light emitting layer 500. That is, an end of the light emitting layer 500 may be disposed to be closer to the end of the substrate 100 than the end of the second electrode 600. In other words, a distance between the end of the light emitting layer 500 and the end of the substrate 100 may be shorter than a distance between the end of the second electrode 600 and the end of the substrate 100.

The second electrode 600 may overlap the second trench T2, but may not overlap the third trench T3. That is, the second electrode 600 may not extend to a third trench T3 region. In this case, the second electrode 600 may be connected to the one side surface of the connection electrode 320, in the second trench T2. This will be described below in detail with reference to FIG. 5.

The encapsulation layer 700 may be formed on the second electrode 600. The encapsulation layer 700 may be provided in the display area DA and the non-display area NDA.

The encapsulation layer 700 may include a first inorganic layer 710, an organic layer 720, and a second inorganic layer 730. The first inorganic layer 710 may be formed on the second electrode 600, the organic layer 720 may be formed on the first inorganic layer 710, and the second inorganic layer 730 may be formed on the organic layer 720.

The first inorganic layer 710 and the second inorganic layer 730 may extend more to the non-display area NDA than the organic layer 720. Accordingly, a top surface of the first inorganic layer 710 may contact a bottom surface of the second inorganic layer 730 at an end of the encapsulation layer 700.

The first inorganic layer 710 and the second inorganic layer 730 may be formed to overlap all of the second trench T2 and the plurality of third trenches T3, in the non-display area NDA. On the other hand, the organic layer 720 may be formed to overlap the second trench T2 and not to overlap some of the plurality of third trenches T3. Accordingly, the first inorganic layer 710 may contact the second inorganic layer 730, in the third trench T3 which does not overlap the organic layer 720. However, depending on the case, the organic layer 720 may overlap all of the second trench T2 and the plurality of third trenches T3.

The third trench T3 may prevent or at least reduce the organic layer 720 from extending to the end of the substrate 100, thereby preventing or at least reducing external oxygen or water from penetrating into the display area DA through the organic layer 720. That is, the organic layer 720 may be filled into at least one of the plurality of third trenches T3, and thus, may not extend to the end of the substrate 100.

Figure 3:
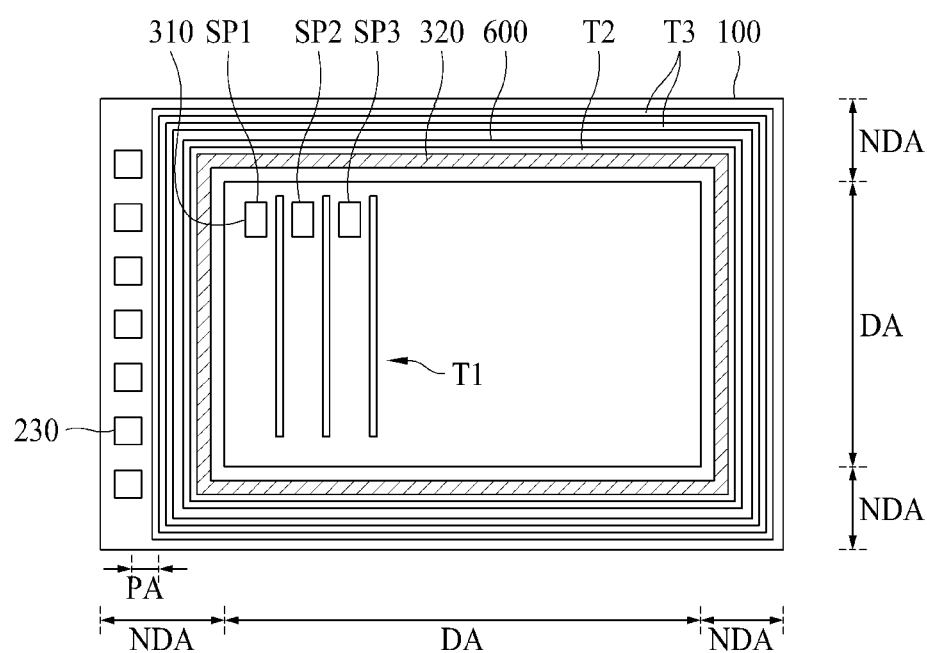
FIG. 3 is a schematic plan view of an electroluminescent display apparatus according to another embodiment of the present disclosure and illustrates an example where a first trench, a second trench, and a third trench according to an embodiment illustrated in FIG. 2 are added to a structure of FIG. 1.

FIG. 3 is a schematic plan view of an electroluminescent display apparatus according to another embodiment of the present disclosure and illustrates an example where the first trench T1, the second trench T2, and the third trench T3 according to an embodiment described above with reference to FIG. 2 are added to a structure of FIG. 1. Therefore, only a configuration of each of first trench T1, the second trench T2, and the third trench T3 will be described below.

As seen in FIG. 3, the first trench T1 may be formed in a boundary region between the subpixels SP1 to SP3 in the display area DA. The first trench T1, as illustrated, may be formed in a boundary region between left and right subpixels SP1 to SP3 and may be implemented in a stripe structure, but is not limited thereto and may be additionally formed in a boundary region between upper and lower subpixels SP1 to SP3 and may be implemented in a mesh structure.

The second trench T2 may correspond to a contact region between the second electrode 600 and the connection electrode 320, and in order to increase the contact region between the second electrode 600 and the connection electrode 320, the second trench T2 may be formed in a region between the end of the second electrode 600 and the one side surface of the connection electrode 320 (for example, an outer surface of the connection electrode 320), and particularly, may be implemented in a tetragonal frame structure which is continued to surround the connection electrode 320. However, the present disclosure is not limited thereto, and the second trench T2 may be implemented in only a partial structure (for example, a structure of a vertical side facing the left pad area PA) of the tetragonal frame structure.

The plurality of third trenches T3 may be formed in a region between the end of the second electrode 600 and the end of the substrate 100, and particularly, may be implemented in a tetragonal frame structure which is continued along an outer portion of the second electrode 600 to surround the second electrode 600. The plurality of third trenches T3 may be formed between the pad area PA and the end of the second electrode 600.

Figure 4:
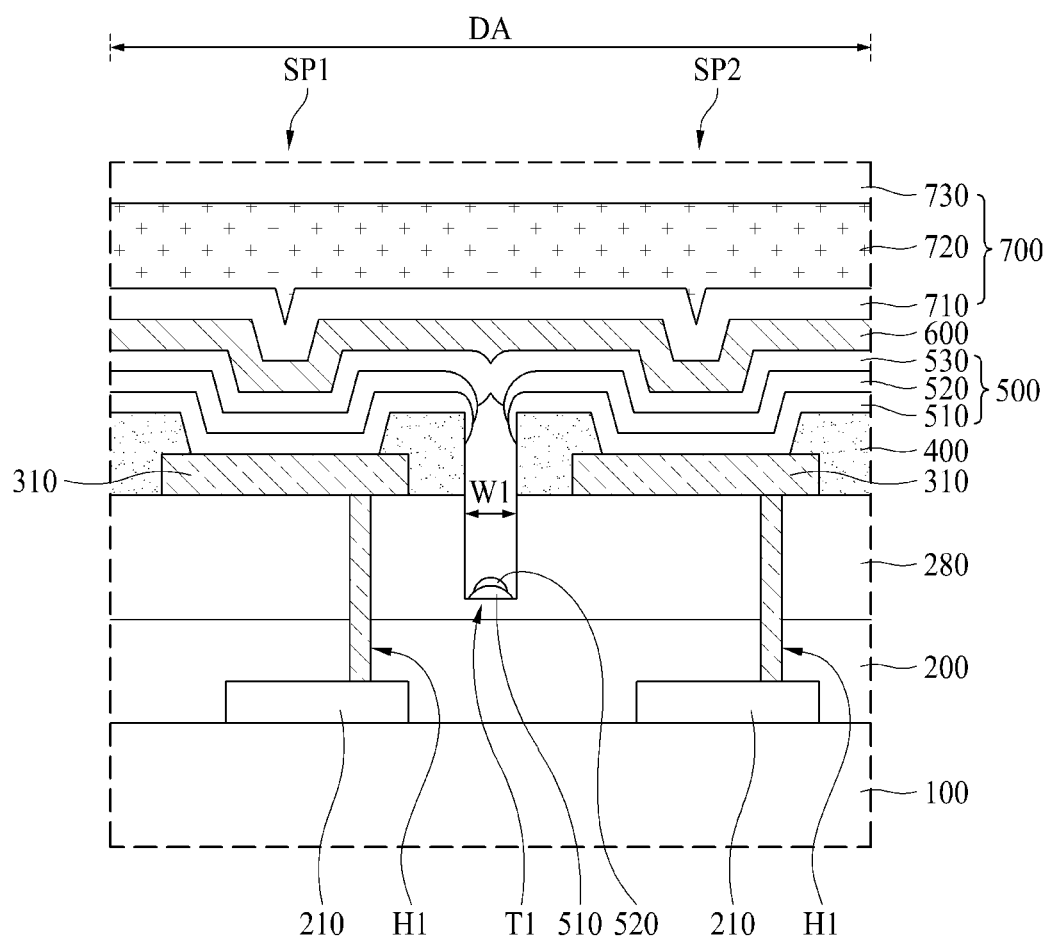
FIG. 4 is a schematic cross-sectional view of an electroluminescent display apparatus according to another embodiment of the present disclosure and corresponds to a cross-sectional surface of a first trench region of a display area.

FIG. 4 is a schematic cross-sectional view of an electroluminescent display apparatus according to another embodiment of the present disclosure and corresponds to a cross-sectional surface of a first trench T1 region of the display area DA of FIG. 2.

As seen in FIG. 4, the electroluminescent display apparatus according to another embodiment of the present disclosure may include a substrate 100, a circuit element layer 200, an interlayer insulation layer 280, a first electrode 310, a bank 400, a light emitting layer 500, a second electrode 600, and an encapsulation layer 700.

The circuit element layer 200 may be formed on the substrate 100 and may include a source or drain electrode 210 of a driving TFT in each of a first subpixel SP1 and a second subpixel SP2.

The interlayer insulation layer 280 may be formed on the circuit element layer 200. The circuit element layer 200 and the interlayer insulation layer 280 may include a first hole H1 in each of the first subpixel SP1 and the second subpixel SP2.

The first electrode 310 may be patterned in each of the first subpixel SP1 and the second subpixel SP2 and may be connected to the source or drain electrode 210 of the driving TFT through the first hole H1.

The bank 400 may be formed to cover both ends of the first electrode 310.

A first trench T1 having a first width W1 may be formed in the bank 400 and the interlayer insulation layer 280, in a boundary region between the first subpixel SP1 and the second subpixel SP2.

The light emitting layer 500 may be formed on the first electrode 310 and the bank 400.

The light emitting layer 500 may be provided to emit white (W) light, and to this end, the light emitting layer 500 may include a plurality of stacks which emit lights of different colors. In detail, the light emitting layer 500 may include a first stack 510, a second stack 530, and a charge generating layer 520 provided between the first stack 510 and the second stack 530.

The first stack 510 may be implemented in a stack structure of a hole injection layer, a hole transport layer, a first organic light emitting layer emitting light of blue or yellow green, and an electron transport layer, and the second stack 530 may be implemented in a stack structure of a hole transport layer, a second organic light emitting layer emitting light of yellow green or blue, an electron transport layer, and an electron injection layer. The charge generating layer 520 may include an N-type charge generating layer provided on the first stack 510 and a P-type charge generating layer provided on the N-type charge generating layer.

The first stack 510 may be discontinuous in the first trench T1. In detail, with respect to a center portion of the first trench T1, a portion of the first stack 510 formed on one side surface (for example, a left side surface) of an inner portion of the first trench T1 may be disconnected from a portion of the first stack 510 formed on the other side surface (for example, a right side surface) of the inner portion of the first trench T1. Also, a portion of the first stack 510 formed on a bottom surface of the inner portion of the first trench T1 may be disconnected from the portions of the first stack 510 formed on the one side surface and the other side surface of the inner portion of the first trench T1. Accordingly, an electric charge may not move through the first stack 510, between subpixels SP1 and SP2 disposed adjacent to each other with the first trench T1 therebetween.

The charge generating layer 520 may be formed on the first stack 510 and may be discontinuous in the first trench T1 or in a region overlapping the first trench T1. In detail, with respect to the center portion of the first trench T1, a portion of the charge generating layer 520 formed at one side (for example, a left side) of the first trench T1 may be disconnected from a portion of the charge generating layer 520 formed at the other side (for example, a right side) of the first trench T1. Also, a portion of the charge generating layer 520 formed on the bottom surface of the inner portion of the first trench T1 may be disconnected from the portions of the charge generating layer 520 formed at the one side and the other side of the inner portion of the first trench T1. Accordingly, an electric charge may not move through the charge generating layer 520, between the subpixels SP1 and SP2 disposed adjacent to each other with the first trench T1 therebetween.

The second stack 530 may be formed not to be disconnected and to be continued between subpixels SP1 and SP2 disposed adjacent to each other with the first trench T1 therebetween, on the charge generating layer 520. That is, with respect to the center portion of the first trench T1, a portion of the second stack 530 formed at one side (for example, a left side) of the first trench T1 may be connected to a portion of the second stack 530 formed at the other side (for example, a right side) of the first trench T1. Accordingly, an electric charge may move through the second stack 530, between the subpixels SP1 and SP2 disposed adjacent to each other with the first trench T1 therebetween.

The charge generating layer 520 may be greater in conductivity than the second stack 530. Particularly, the N-type charge generating layer configuring the charge generating layer 520 may include a metal material, and thus, may be greater in conductivity than the second stack 530. Therefore, the movement of an electric charge between the subpixels SP1 and SP2 disposed adjacent to each other may be performed through the charge generating layer 520, and the amount of movement of an electric charge through the second stack 530 may be slight. Accordingly, according to an embodiment of the present disclosure, the charge generating layer 520 may be configured to be discontinuous in a region overlapping the first trench T1, and thus, the movement of an electric charge between the subpixels SP1 and SP2 disposed adjacent to each other may be reduced, thereby preventing the occurrence of a leakage current.

The second electrode 600 may be formed on the light emitting layer 500.

The encapsulation layer 700 may be formed on the second electrode 600. The encapsulation layer 700 may include a first inorganic layer 710, an organic layer 720, and a second inorganic layer 730 which are sequentially stacked.

Figure 5:
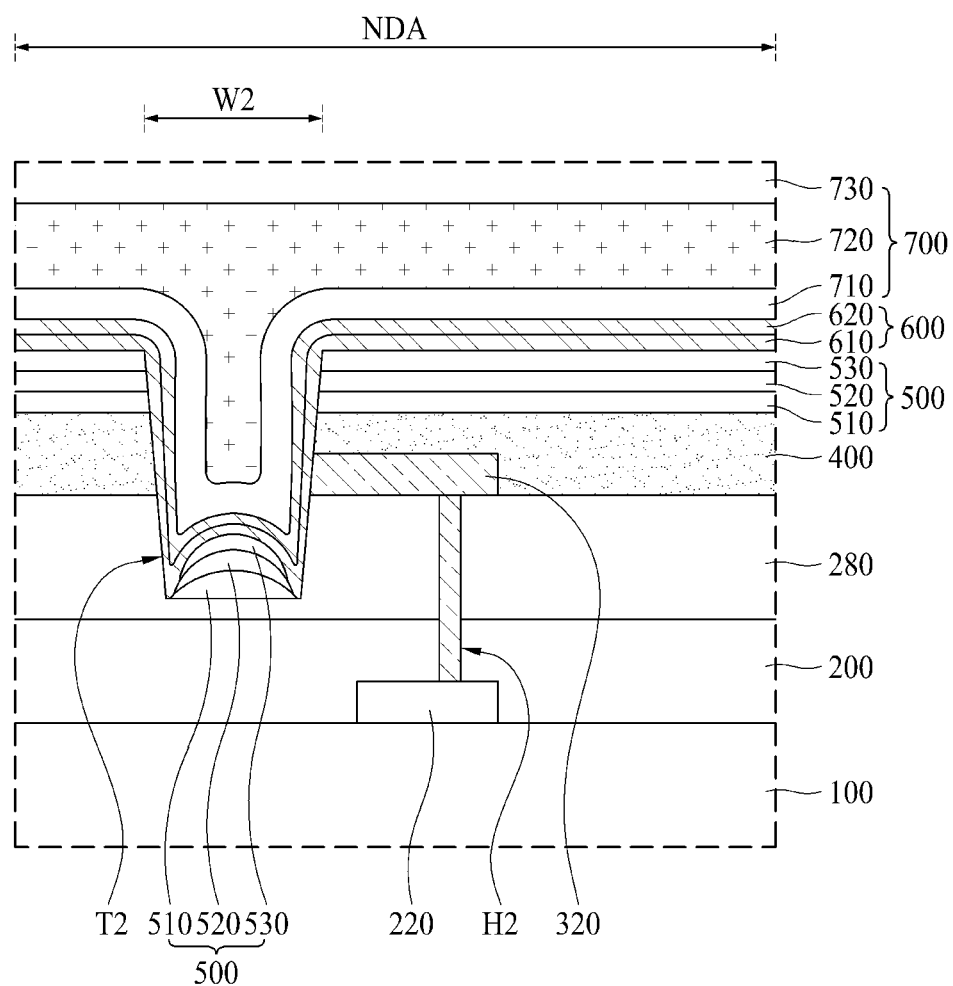
FIG. 5 is a schematic cross-sectional view of an electroluminescent display apparatus according to another embodiment of the present disclosure and corresponds to a cross-sectional surface of a second trench region of a non-display area.

FIG. 5 is a schematic cross-sectional view of an electroluminescent display apparatus according to another embodiment of the present disclosure and corresponds to a cross-sectional surface of the second trench region T2 of the non-display area NDA of FIG. 2.

As seen in FIG. 5, the electroluminescent display apparatus according to another embodiment of the present disclosure may include a substrate 100, a circuit element layer 200, an interlayer insulation layer 280, a connection electrode 320, a bank 400, a light emitting layer 500, a second electrode 600, and an encapsulation layer 700.

The circuit element layer 200 may be formed on the substrate 100 and may include a common electrode 220.

The interlayer insulation layer 280 may be formed on the circuit element layer 200. The circuit element layer 200 and the interlayer insulation layer 280 may include a second hole H2.

The connection electrode 320 may be formed on the interlayer insulation layer 280 and may be connected to the common electrode 220 through the second hole H2.

The bank 400 may be formed on the connection electrode 320 and the interlayer insulation layer 280. In this case, a second trench T2 having a second width W2 may be formed in the bank 400 and the interlayer insulation layer 280. The second trench T2 may be provided to expose the connection electrode 320. That is, one end of the second trench T2 may expose one side surface of the connection electrode 320. Accordingly, the one side surface of the connection electrode 320 may be exposed at an inner portion of the second trench T2. A second width W2 of the second trench T2 may be greater than the first width W1 of the first trench T1 described above.

The light emitting layer 500 may be formed on the bank 400. In this case, the second width W2 of the second trench T2 may be set to be large, and thus, a first stack 510, a charge generating layer 520, and a second stack 530 configuring the light emitting layer 500 may be discontinuous in the second trench T2.

In detail, with respect to a center portion of the second trench T2, a portion of the first stack 510 formed at one side (for example, a left side) of the second trench T2 may be disconnected from a portion of the first stack 510 formed at the other side (for example, a right side) of the second trench T2. Also, a portion of the first stack 510 formed on a bottom surface of an inner portion of the second trench T2 may be disconnected from the portions of the first stack 510 formed at the one side and the other side of the second trench T2.

Similar, with respect to the center portion of the second trench T2, a portion of the charge generating layer 520 formed at the one side (for example, the left side) of the second trench T2, a portion of the charge generating layer 520 formed at the other side (for example, the right side) of the second trench T2, and a portion of the charge generating layer 520 formed on the bottom surface of the inner portion of the second trench T2 may be disconnected from one another.

Moreover, with respect to the center portion of the second trench T2, a portion of the second stack 530 formed at the one side (for example, the left side) of the second trench T2, a portion of the second stack 530 formed at the other side (for example, the right side) of the second trench T2, and a portion of the second stack 530 formed on the bottom surface of the inner portion of the second trench T2 may be disconnected from one another.

Therefore, one side surface of the connection electrode 320 exposed at a side surface of the second trench T2 may be exposed without being covered by the light emitting layer 500.

The second electrode 600 may be formed on the light emitting layer 500. Particularly, the second electrode 600 may not be discontinuous and may be continued in the second trench T2. Accordingly, the second electrode 600 may extend along a side surface of the inner portion of the second trench T2, where the light emitting layer 500 is not formed, and may be connected to a side surface of the connection electrode 320.

In this case, the second electrode 600 may be formed in a two-layer structure of a lower layer 610 and an upper layer 620, which are formed through an individual deposition process. The second electrode 600 may be formed of a single layer, but in this case, there may be a possibility that the second electrode 600 is discontinuous in the second trench T2 due to a process error. In a case where the second electrode 600 is formed in a two-layer structure of the lower layer 610 and the upper layer 620, even when the lower layer 610 is discontinuous in the second trench T2, disconnected lower layers 610 may be connected to one another by the upper layer 620. The lower layer 610 and the upper layer 620 may be formed by a sputtering process where a step coverage is excellent, but depending on the case, only the upper layer 620 may be formed by the sputtering process and the lower layer 610 may be formed by an evaporation process.

The encapsulation layer 700 may be formed on the second electrode 600. The encapsulation layer 700 may include a first inorganic layer 710, an organic layer 720, and a second inorganic layer 730 which are sequentially stacked.

Figure 6:
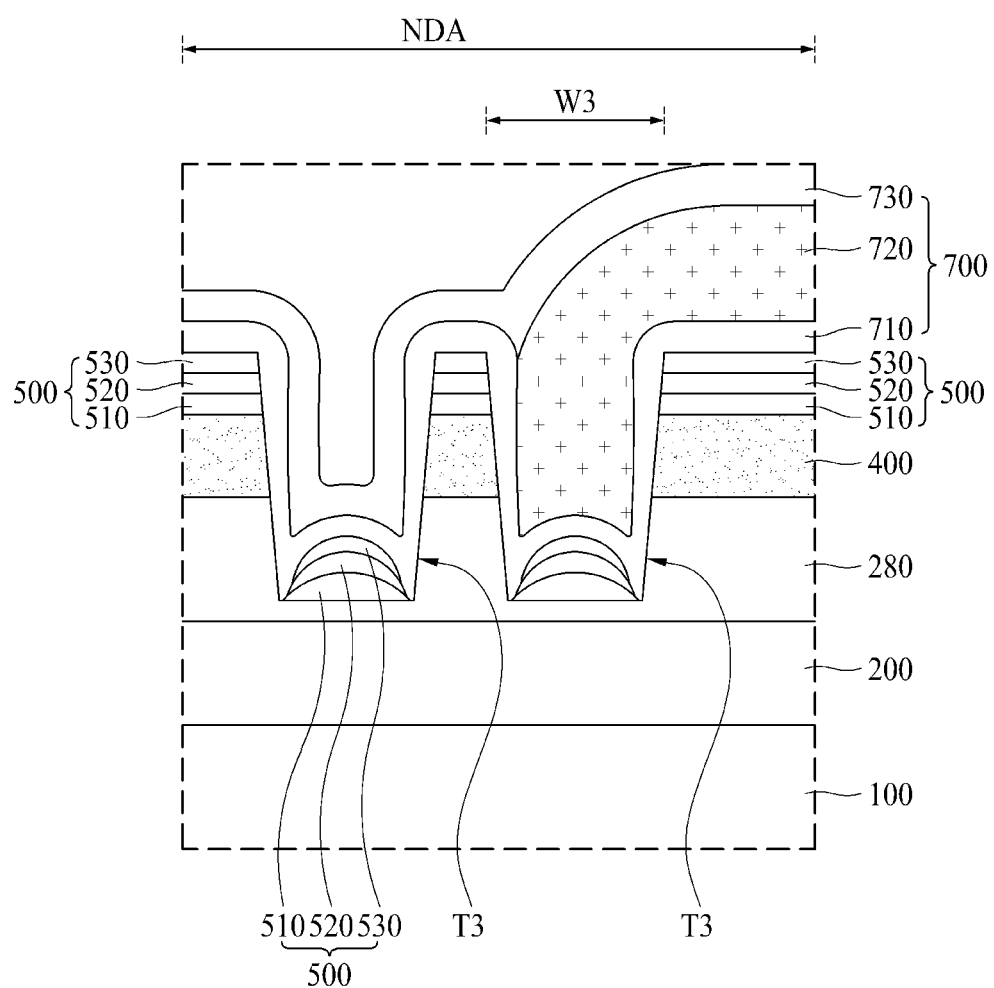
FIG. 6 is a schematic cross-sectional view of an electroluminescent display apparatus according to another embodiment of the present disclosure and corresponds to a cross-sectional surface of a plurality of third trench regions of a non-display area.

FIG. 6 is a schematic cross-sectional view of an electroluminescent display apparatus according to another embodiment of the present disclosure and corresponds to a cross-sectional surface of the plurality of third trench regions T3 of the non-display area NDA of FIG. 2.

As seen in FIG. 6, the electroluminescent display apparatus according to another embodiment of the present disclosure may include a substrate 100, a circuit element layer 200, an interlayer insulation layer 280, a bank 400, a light emitting layer 500, and an encapsulation layer 700.

The circuit element layer 200 may be formed on the substrate 100, the interlayer insulation layer 280 may be formed on the circuit element layer 200, and the bank 400 may be formed on the interlayer insulation layer 280. In this case, a plurality of third trenches T3 each having a third width W3 may be formed in the bank 400 and the interlayer insulation layer 280. A third width W3 of the third trench T3 may be greater than the first width W1 of the first trench T1 described above.

The light emitting layer 500 may be formed on the bank 400. In this case, like FIG. 5 described above, a first stack 510, a charge generating layer 520, and a second stack 530 configuring the light emitting layer 500 may be discontinuous in the plurality of third trenches T3.

The encapsulation layer 700 may be formed on a top surface of the light emitting layer 500 to contact the light emitting layer 500. The encapsulation layer 700 may include a first inorganic layer 710, an organic layer 720, and a second inorganic layer 730 which are sequentially stacked.

In this case, the first inorganic layer 710 and the second inorganic layer 730 may overlap the plurality of third trenches T3 and may overlap all of the light emitting layer 500. Particularly, the first inorganic layer 710 may be continued along a side surface of an inner portion of each of the plurality of third trenches T3. On the other hand, the organic layer 720 may overlap one third trench T3 but may not overlap one other third trench T3, and thus, may overlap a portion of the light emitting layer 500 but may not overlap another portion of the light emitting layer 500. As a result, an end region of the encapsulation layer 700 may be implemented in a structure where the organic layer 720 is not provided and the first inorganic layer 710 contacts the second inorganic layer 730, thereby preventing external water or oxygen from penetrating through the end region of the encapsulation layer 700.

FIGS. 7A to 7H are schematic cross-sectional views of manufacturing process of an electroluminescent display apparatus according to an embodiment of the present disclosure and are manufacturing process views of the electroluminescent display apparatus of FIG. 2 described above. Therefore, detailed descriptions of the same elements are omitted.

Figure 7A:
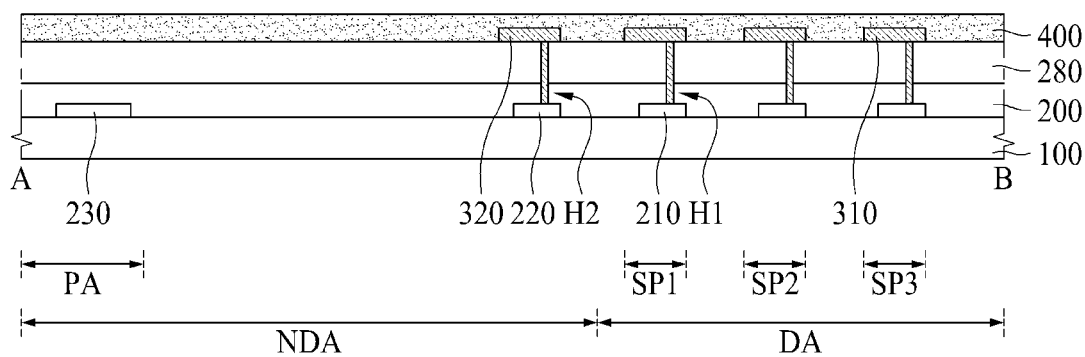
FIGS. 7A to 7H are schematic cross-sectional views of manufacturing process of an electroluminescent display apparatus according to an embodiment of the present disclosure.

First, as seen in FIG. 7A, a circuit element layer 200 including a source or drain electrode 210 of a driving TFT, a common electrode 220, and a pad electrode 230 may be formed on a substrate 100. The source or drain electrode 210 may be patterned in each of subpixels SP1 to SP3 in a display area DA of the substrate 100, the common electrode 220 may be patterned in a non-display area NDA of the substrate 100, and the pad electrode 230 may be patterned in a pad area PA of the substrate 100.

Subsequently, an interlayer insulation layer 280 may be formed on the circuit element layer 200, a first hole H1 may be formed in the interlayer insulation layer 280 and the circuit element layer 200 to expose the source or drain electrode 210, and a second hole H2 may be formed in the interlayer insulation layer 280 and the circuit element layer 200 to expose the common electrode 220 simultaneously.

Subsequently, a first electrode 310 and a connection electrode 320 may be formed on the interlayer insulation layer 280. The first electrode 310 may be connected to the source or drain electrode 210 through the first hole H1, and the connection electrode 320 may be connected to the common electrode 220 through the second hole H2.

Subsequently, a bank 400 may be formed on a whole surface of the substrate 100. The bank 400 may be formed on the interlayer insulation layer 280, the first electrode 310, and the connection electrode 320.

Figure 7B:
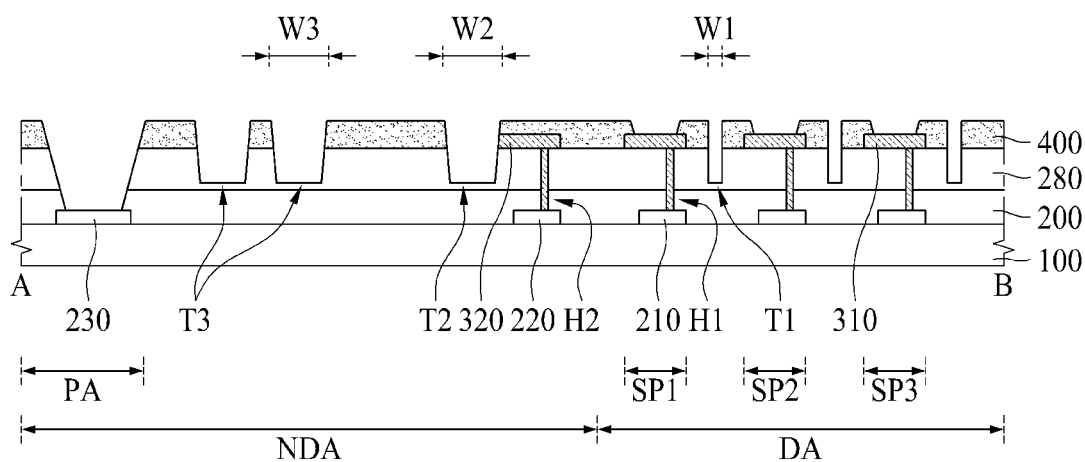

Subsequently, as seen in FIG. 7B, a plurality of first trenches T1, a second trench T2, a plurality of third trenches T3, and a contact hole CH may be formed by removing a certain region of each of the bank 400 and the interlayer insulation layer 280.

The plurality of first trenches T1 may be formed in a boundary region between subpixels SP1 to SP3 in the display area DA, the second trench T2 may be formed to expose one side surface of the connection electrode 320 in the non-display area NDA, the plurality of third trenches T3 may be formed in a region between the second trench T2 and the pad electrode 230, and the contact hole CH may be formed to expose the pad electrode 230.

In this case, the contact hole CH may be formed first, and then, the plurality of first trenches T1, the second trench T2, and the plurality of third trenches T3 may be formed simultaneously.

Subsequently, a certain region of the bank 400 provided on the first electrode 310 may be removed for exposing a portion of a top surface of the first electrode 310.

Figure 7C:
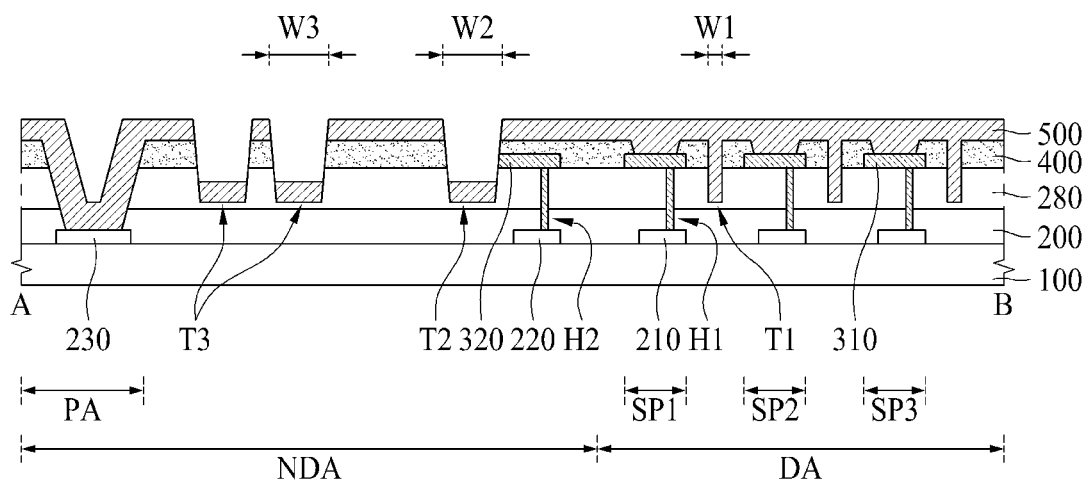

Subsequently, as seen in FIG. 7C, a light emitting layer 500 may be formed on a whole surface of the substrate 100 without a mask. Therefore, the light emitting layer 500 may be formed on the bank 400 and the exposed portion of the top surface of the first electrode 310, and moreover, may be formed in the plurality of first trenches T1, the second trench T2, the plurality of third trenches T3, and the contact hole CH. A configuration of the light emitting layer 500 formed in the plurality of first trenches T1, the second trench T2, and the plurality of third trenches T3 is as described above with reference to FIGS. 4 to 6.

Figure 7D:
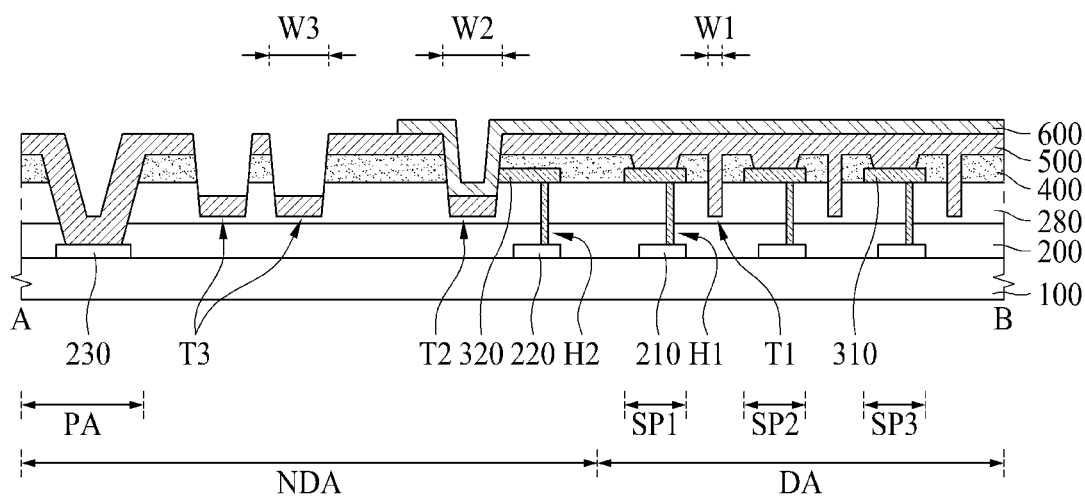

Subsequently, as seen in FIG. 7D, a second electrode 600 may be formed on the light emitting layer 500. The second electrode 600 may extend from the display area DA to the non-display area NDA, and particularly, may extend via an inner portion of the second trench T2, but may not extend up to the plurality of third trenches T3. In this case, as described above with reference to FIG. 5, the second electrode 600 may contact one side surface of the connection electrode 320 in the second trench T2, and may be formed in a two-layer structure of a lower layer 610 and an upper layer 620.

Figure 7E:
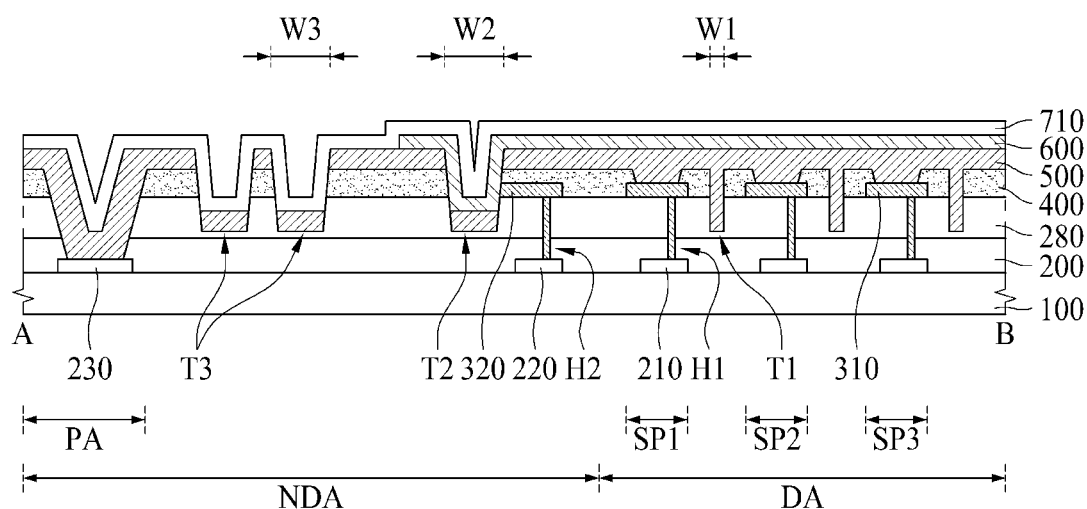

Subsequently, as seen in FIG. 7E, a first inorganic layer 710 may be formed on the whole surface of the substrate 100. The first inorganic layer 710 may be formed on the second electrode 600 and a top surface of the light emitting layer 500, and moreover, may be formed in the second trench T2, the plurality of third trenches T3, and the contact hole CH.

Figure 7F:
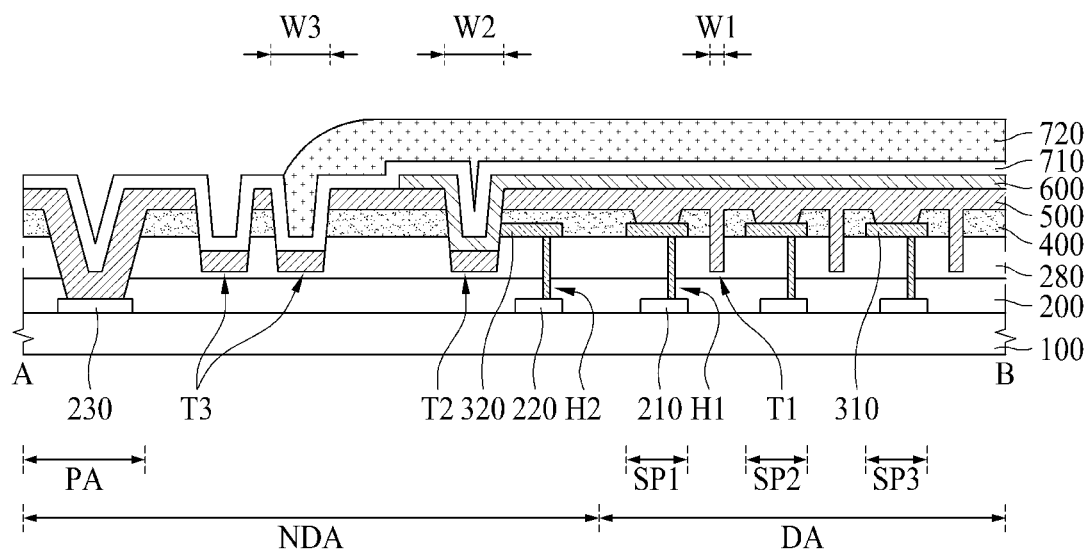

Subsequently, as seen in FIG. 7F, an organic layer 720 may be formed on the first inorganic layer 710. The organic layer 720 may fill the second trench T2 and some of the plurality of third trenches T3 but may not fill the other third trenches T3.

Figure 7G:
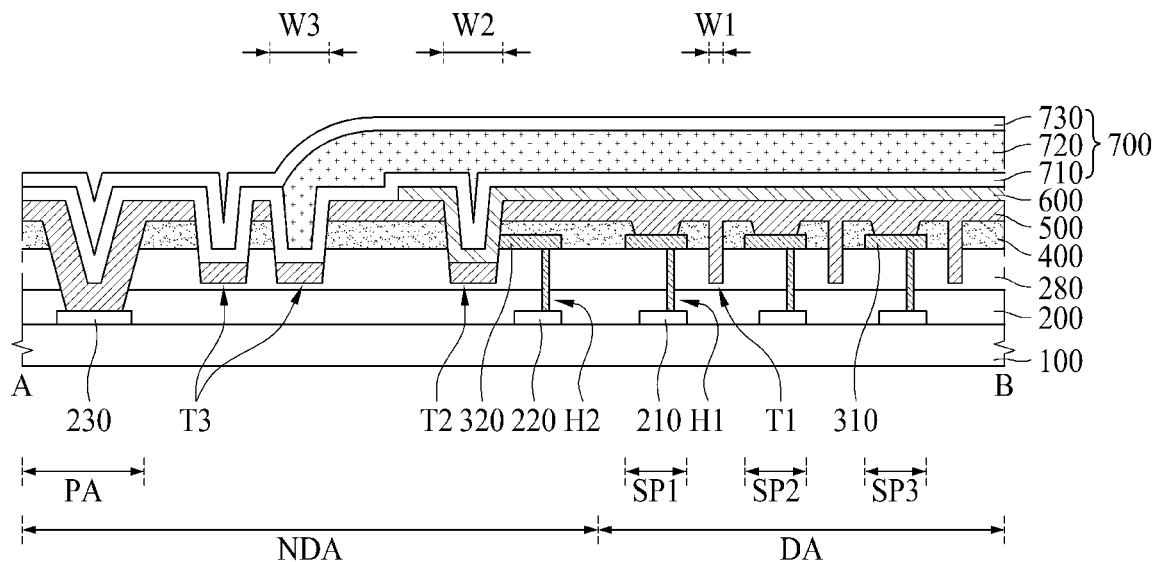

Subsequently, as seen in FIG. 7G, a second inorganic layer 730 may be formed on the whole surface of the substrate 100. The second inorganic layer 730 may be formed on the organic layer 720 and the first inorganic layer 710. Particularly, the second inorganic layer 730 may be formed in the other third trenches T3 unfilled by the organic layer 720 and in the contact hole CH.

Figure 7H:
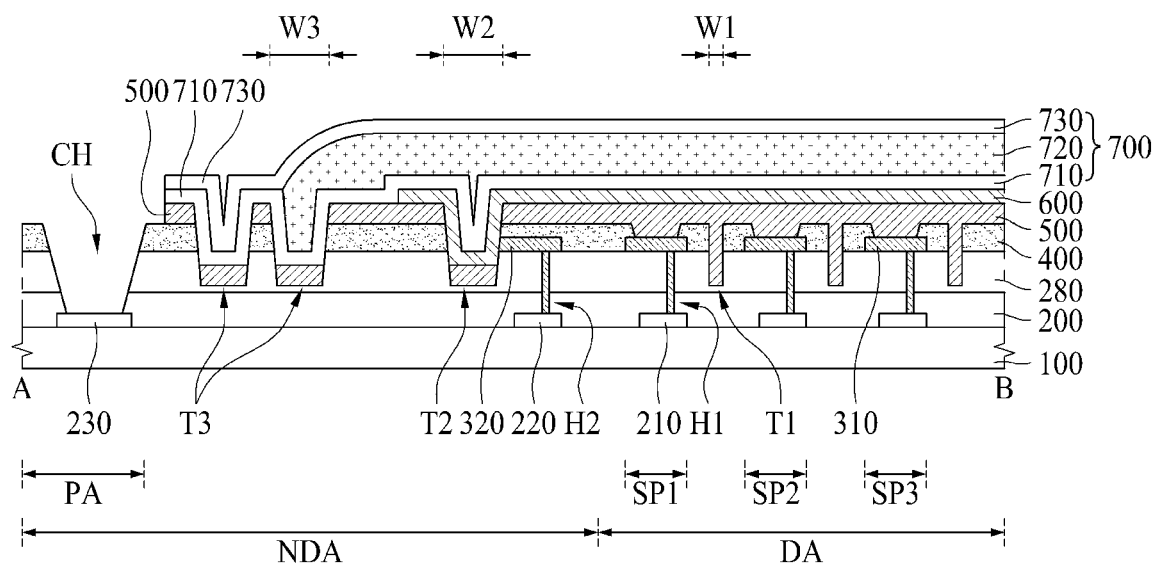

Subsequently, as seen in FIG. 7H, the pad electrode 230 may be exposed by removing the light emitting layer 500, the first inorganic layer 710, and the second inorganic layer 730 which are formed in the pad area PA.

As described above, according to an embodiment of the present disclosure, because the light emitting layer 500 is formed without a mask, a problem may be solved where the light emitting layer 500 is polluted by particles caused by the mask.

Figure 8A:
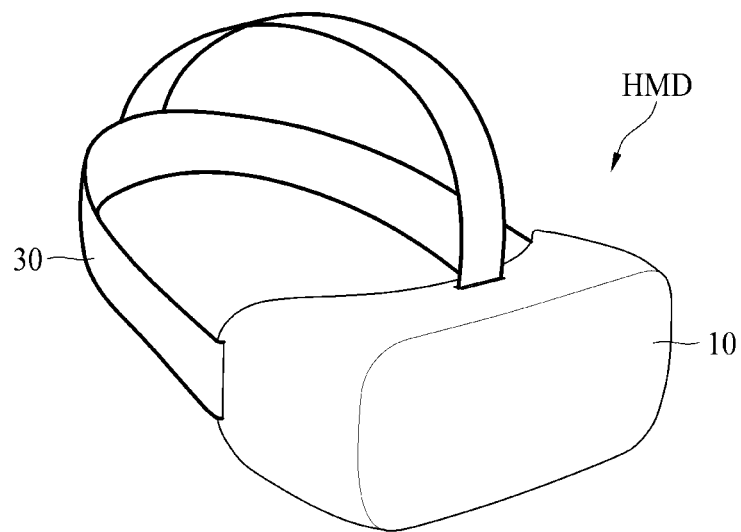
FIGS. 8A to 8C relate to an electroluminescent display apparatus according to another embodiment of the present disclosure and relate to a head-mounted display (HMD) apparatus.
Figure 8B:
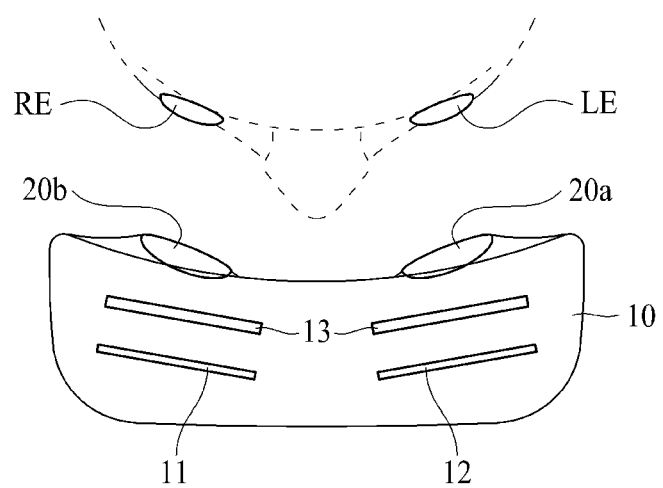
Figure 8C:
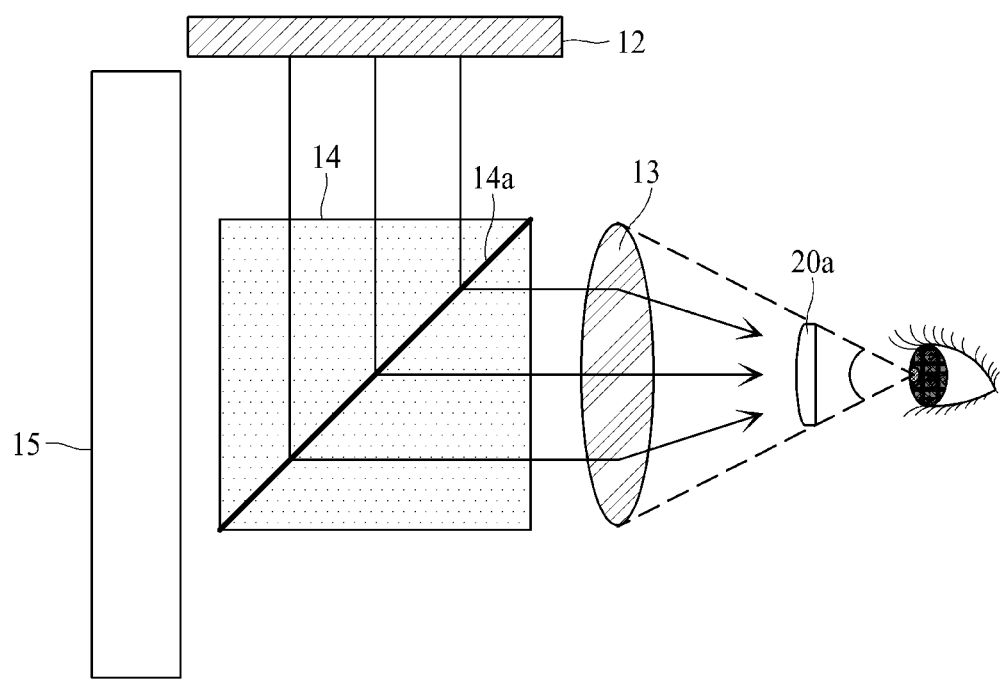

FIGS. 8A to 8C relate to an electroluminescent display apparatus according to another embodiment of the present disclosure and relate to a head-mounted display (HMD) apparatus.

As seen in FIG. 8A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface and both side surfaces of a user, but is not limited thereto. The head-mounted band 30 may fix the HMD apparatus to a head of a user and may be replaced by a glasses frame type structure or a helmet type structure.

As seen in FIG. 8B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus as described above. In this case, in the electroluminescent display apparatus, a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 8C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 8C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display apparatus as described above. In this case, in the electroluminescent display apparatus, a surface displaying an image may face the lens array 13.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14a which transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to the embodiments of the present disclosure, because a trench is formed in a non-display area, a light emitting layer may be discontinuous in the trench, and a second electrode may be connected to a connection electrode in the trench, and thus, the light emitting layer may be formed without a mask, thereby solving a problem where particles occurs due to the mask.

According to the embodiments of the present disclosure, a plurality of trenches may be additionally formed at an outer portion of the second electrode in the non-display area, and thus, an organic layer configuring an encapsulation layer may not extend to an end of a substrate, thereby preventing external oxygen or water from penetrating into a display area through the organic layer.

According to the embodiments of the present disclosure, another trench may be additionally formed in a boundary region between adjacent subpixels in the display area, and thus, a charge generating layer configuring the light emitting layer may be discontinuous in the other trench, thereby solving a problem where a leakage current occurs between adjacent subpixels.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An electroluminescent display apparatus comprising:
a substrate including a display area including a plurality of subpixels and a non-display area that is outside the display area;
a first electrode in each of the plurality of subpixels in the display area of the substrate;
a connection electrode in the non-display area of the substrate, the connection electrode including a top surface, a bottom surface and a lateral surface between the top surface and the bottom surface;
a bank covering both ends of the first electrode, the bank covering a top surface of the connection electrode;
a light emitting layer on the first electrode and the bank in the display area and the non-display area; and
a second electrode on the light emitting layer,
wherein, a trench is in the bank in the non-display area, one side the lateral surface of one end of the connection electrode is exposed at an inner portion of the trench, and the second electrode extends to the inner portion of the trench and contacts the lateral one side surface of the one end of the connection electrode.

2. The electroluminescent display apparatus of claim 1, wherein one end of the trench exposes the lateral surface of the connection electrode, and the top surface of the connection electrode and another lateral surface of the connection electrode are covered by the bank.

3. The electroluminescent display apparatus of claim 1, wherein the light emitting layer overlaps the connection electrode and is discontinuous in the trench.

4. The electroluminescent display apparatus of claim 1, wherein the light emitting layer is on a bottom surface of the inner portion of the trench and exposes the lateral surface of the connection electrode.

5. The electroluminescent display apparatus of claim 1, wherein a plurality of other trenches are provided in the bank outside the trench in the non-display area, and the light emitting layer is discontinuous in the plurality of other trenches.

6. The electroluminescent display apparatus of claim 5, wherein the second electrode does not overlap the plurality of other trenches.

7. The electroluminescent display apparatus of claim 5, further comprising:
an encapsulation layer including a first inorganic layer on the second electrode, an organic layer on the first inorganic layer, and a second inorganic layer on the organic layer,
wherein the first inorganic layer and the second inorganic layer overlap the plurality of other trenches, and the organic layer does not overlap at least one of the plurality of other trenches.

8. The electroluminescent display apparatus of claim 1, wherein another trench is in the bank in the display area in a boundary region between the plurality of subpixels, and
a width of the trench provided in the non-display area is greater than a width of the other trench in the display area.

9. The electroluminescent display apparatus of claim 8, wherein the light emitting layer comprises a first stack, a charge generating layer, and a second stack, the first stack, the charge generating layer, and the second stack are discontinuous in the trench provided in the non-display area, and the first stack and the charge generating layer are discontinuous in the another trench provided in the display area, and the second stack is continued in the other trench in the display area.

10. The electroluminescent display apparatus of claim 1, further comprising an interlayer insulation layer provided under the bank,
wherein the trench extends to an inner portion of the interlayer insulation layer.

11. The electroluminescent display apparatus of claim 1, wherein the first electrode and the connection electrode comprise a same material and are provided on a same layer.

12. The electroluminescent display apparatus of claim 1, wherein the first electrode is connected to a source electrode or a drain electrode of a driving thin film transistor through a first hole, and the connection electrode is connected to a common electrode through a second hole, and
the source electrode or the drain electrode and the common electrode comprise a same material and are provided on a same layer.

13. The electroluminescent display apparatus of claim 1, further comprising a pad electrode provided in the non-display area,
wherein the bank comprises a contact hole exposing the pad electrode.

14. The electroluminescent display apparatus of claim 1, further comprising:
a lens array apart from the substrate; and
an accommodating case accommodating the substrate and the lens array.

15. An electroluminescent display apparatus comprising:
a substrate including a display area including a plurality of subpixels and a non-display area that is outside the display area;
a first electrode in each of the plurality of subpixels in the display area of the substrate;
a light emitting layer on the first electrode in the display area and the non-display area;
a second electrode on the light emitting layer in the display area and the non-display area;
a connection electrode in the non-display area, the connection electrode overlapping the second electrode and connected to the second electrode and including a top surface, a bottom surface and a lateral surface between the top surface and the bottom surface; and a trench in the non-display area, the trench overlapping the second electrode and exposes the lateral surface of the connection electrode, wherein the second electrode contacts the lateral surface of the connection electrode in the trench.

16. The electroluminescent display apparatus of claim 15, wherein the light emitting layer is on a bottom surface of the trench and exposes the lateral surface of the connection electrode.

17. The electroluminescent display apparatus of claim 15, wherein the connection electrode is in a frame structure which is continued along an outer portion of the display area, between an end of the second electrode and the display area.

18. The electroluminescent display apparatus of claim 17, wherein the trench is in a frame structure which is continued along the lateral surface of the connection electrode, between the end of the second electrode and the connection electrode.

19. The electroluminescent display apparatus of claim 15, further comprising a plurality of other trenches outside the trench in the non-display area, wherein the plurality of other trenches are in a frame structure which is continued along an outer portion of the second electrode, between an end of the substrate and an end of the second electrode.

20. The electroluminescent display apparatus of claim 15, further comprising another trench provided in a boundary region between the plurality of subpixels in the display area, and a width of the trench provided in the non-display area is greater than a width of the other trench provided in the display area.

* * * * *